United States Patent [19]
Gaudet

[11] Patent Number: 6,121,808
[45] Date of Patent: Sep. 19, 2000

[54] DLL CALIBRATED PHASE MULTIPLEXER AND INTERPOLATOR

[75] Inventor: Brian Gaudet, San Jose, Calif.

[73] Assignee: National Semiconductor Corporation, Santa Clara, Calif.

[21] Appl. No.: 09/080,860

[22] Filed: May 18, 1998

[51] Int. Cl.[7] .................................................. H03H 11/16
[52] U.S. Cl. ........................................................... 327/231
[58] Field of Search ..................................... 327/231, 233, 327/236, 295, 298, 403, 407

*Primary Examiner*—Jeffrey Zweizig
*Attorney, Agent, or Firm*—Limbach & Limbach L.L.P.

[57] ABSTRACT

A programmable phase adjuster spans a clock signal's period with N linearly distributed phase steps. The resulting phase adjust resolution is finer than that of an inverter delay for a given process. Enhancement of the phase resolution of a phase picker CRM architecture enables use of the architecture for recovering clock signals from high data rate data streams in a way that minimizes power and area and allows optimization for multi-channel applications.

1 Claim, 3 Drawing Sheets

DLL CALIBRATED PHASE MULTIPLEXER AND INTERPOLATOR

TECHNICAL FIELD

The present invention is directed to circuits for recovering a clock signal from a data stream and, more specifically, to a programmable phase interpolator that can be used to generate a set of evenly spaced phase steps that span the period of a recovered clock signal. Enhanced phase resolution can be used to more accurately recover the clock signal and data from the data stream.

BACKGROUND OF THE INVENTION

A common function of transmit and receive stations is to extract a clock signal from the data stream transmitted between the stations and to use the recovered clock signal to properly synchronize the operations performed on the incoming data, e.g., sampling and decoding of the data. In order to use the clock signal, it must be of the same frequency as and as close in phase as possible to the transmitted data stream.

A phase picker clock recovery architecture adjusts the phase of a recovered clock signal in response to a filtered phase error provided by a phase detector. The phase detector compares the phase of the recovered clock signal with the incoming data, generating an error signal representing the phase difference between the signals. The error signal is used to drive an adaptive control loop which seeks to minimize the phase difference by selecting a different phase of N phases of a reference clock signal, provided by a clock generation module (CGM), to be an updated clock signal. The N phases of the reference clock signal generated by the clock generation module are provided by tapping off of an N/2 stage differential voltage controlled oscillator (VCO). The selected phase of the reference clock signal is then used as the recovered clock signal and compared to the data stream to update the error term. An N:1 phase multiplexer having the N phases of the reference signal as inputs is used to perform the actual phase selection.

The loop parameters of a phase picker clock recovery system are independent of PVT (process-voltage-temperature) and the CRM (clock recovery module) is completely digital.

A limitation of such architectures is that a phase picker CRM only works for narrow band clock recovery applications. In some situations, this is not a problem. For example, the ethernet 10BT, 100BX and 1000BX standards are such that a narrow band CRM is adequate. However, the problem with extending a phase picker type CRM to recover clocks for higher frequency protocols, such as 100 mb and 1000 mb ethernet, is that the jitter tolerance is limited by the phase adjust resolution of the phase multiplexer. Simulations using a platform that has been correlated well to silicon show that a phase adjust resolution of 200 ps is required for 100 mb ethernet clock recovery, while a 30 ps phase adjust resolution is required for 1000 mb ethernet. A phase adjust step of 30 ps requires a differential VCO stage of delay under 30 ps at slow PVT. This is impossible to implement on current CMOS processes, where such a delay is on the order of 500 ps.

In the absence of using a phase picker architecture, there are several available methods for enhancing the resolution of a phase multiplexer in order to improve the clock recovery function of a circuit.

Coupled VCOs have been used to enhance the number of phase steps that can be obtained from a single VCO. For example, in "Precise-Delay Generation Using Coupled Oscillators", a dissertation by John Maneatis, Stanford University, June 1994, a method of coupling MN stage ring oscillators is described. The method provides M*N phases of the VCO frequency with a phase difference between adjacent phases enhanced by a factor of M beyond that possible using a single N phase VCO.

Another method involves using an array of delay-locked-loops (DLL). This method is described by J. Christianson, CERN, Geneva, in a publication entitled "An Integrated High Resolution CMOS Timing Generator Based on an Array of Delay Locked Loops." The Christianson method uses M delay-locked-loops of N stages, the inputs for which come from consecutive stages of an M stage delay-locked-loop. This provides a delay resolution of a delay in the N stage phase-locked-loop divided by M.

Another approach to enhancing phase resolution uses a mixer to interpolate between two CGM phases, doubling both the number of phases and the phase adjust resolution. This procedure can be repeated (doubling again), but simulations have shown that beyond two doublings, the precision of the enhanced phase resolution steps degrades.

Finally, an uncompensated interpolation method using inverters with switchable loads to produce an adjustable delay is described by M. Bazes et al. in "An Interpolating Clock Synthesizer", IEEE Journal of Solid-State Circuits, Vol. 31, No. 9, September 1996. This method uses inverters with N switchable loads to create the adjustable delay. The delay interpolator is calibrated by determining how many loads are required to be connected to span one gross phase step. Once this number is determined, the remaining loads are disabled. The number of points in the interpolation change depends upon PVT. For example, for fast PVT, it may take ten loads to span the gross phase step, while at slow PVT, it may take only three. This makes the actual delay step of the interpolator a function of PVT, which is acceptable for a CGM, but it is not acceptable for a CRM, where the phase step resolution is a critical parameter.

What is desired is an apparatus for increasing the phase resolution of the clock signals selected by a phase multiplexer which is part of a clock recovery circuit and which overcomes the limitations of existing devices.

SUMMARY OF THE INVENTION

The present invention is directed to a programmable phase interpolator that can be used to span a clock signal's period with N linearly distributed phase steps. The resulting phase adjust resolution is finer than that of an inverter delay for a given process.

An important application of the invention is to enhance the phase resolution of a phase picker CRM architecture. This enables using the architecture for recovering clock signals from high data rate data streams. The invention does this in a way that minimizes power and area and allows optimization for multi-channel applications such as ethernet switches and repeaters.

Further objects and advantages of the present invention will become apparent from the following detailed description and accompanying drawings which sets forth an illustrative embodiment in which the principles of the invention are utilized.

DETAILED DESCRIPTION OF THE INVENTION

Figure 1:
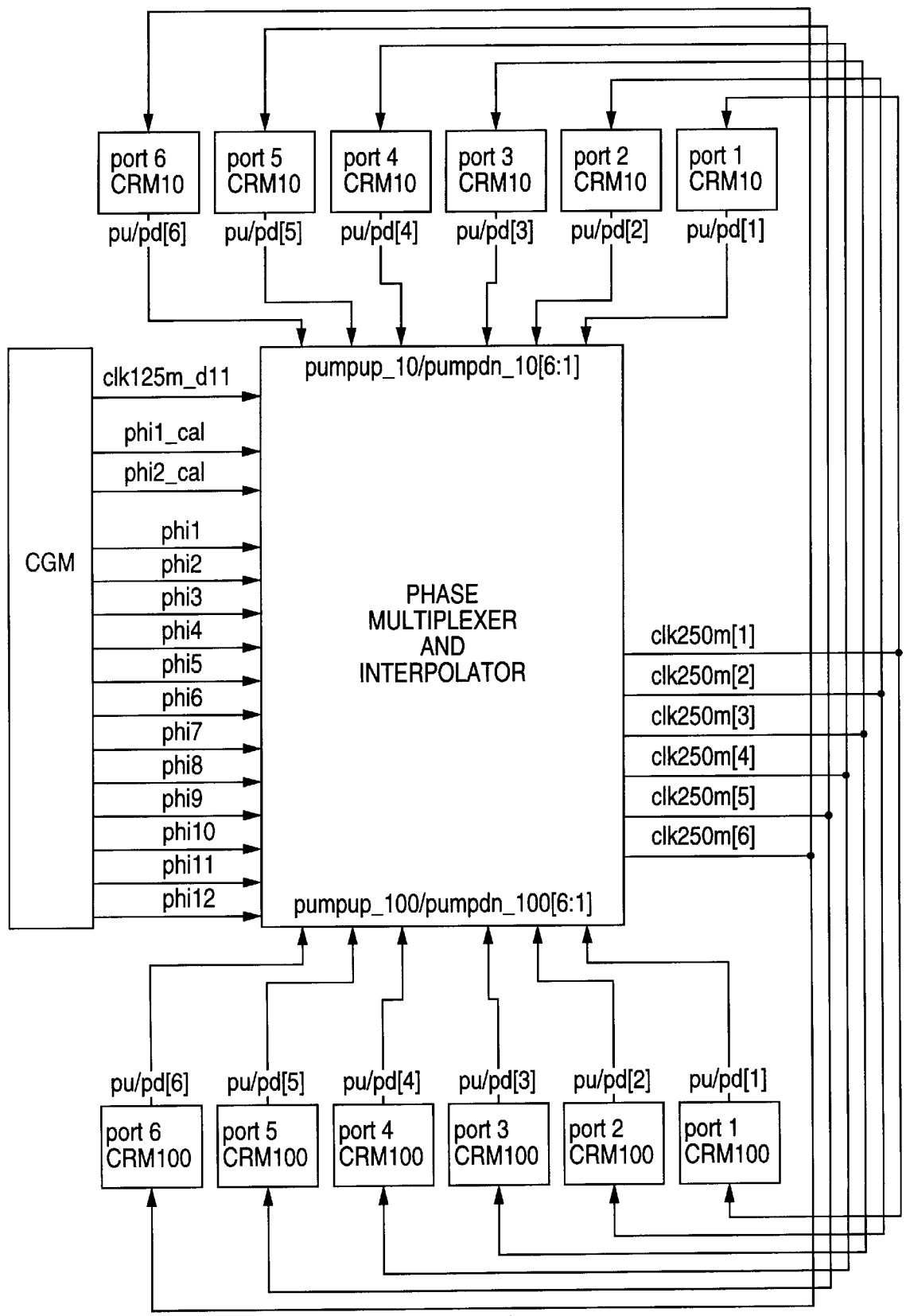
FIG. 1 is a block diagram illustrating utilization of a single clock generation module (CGM) and a phase multiplexer and interpolator block in accordance with the present invention to provide a phase adjust function in a multi-data rate, multi-channel environment.

Referring to FIG. 1 the present invention will now be described in the context of a phase picker type clock recovery module (CRM) architecture which uses a clock generation module (CGM) 12 to provide twelve differential phases (phi [1:12]) of a 250 Mhz clock signal. These phases are provided to a phase multiplexer and a delay-locked-loop (DLL) calibrated adjustable load delay interpolator 10 that is used to break down the 333 ps (pico-second)-sized phase steps from the phase multiplexer into 55 ps-sized phase steps.

Referring to FIG. 1, the invention is described in the context of a multi-port, multi-channel environment. A single clock generation module (CGM) 12 and N phase multiplexers, one for each channel, is used to select one of M phases for each channel. The phase interpolator 10 provides the required phase resolution by creating a number of delay steps evenly spaced between the coarse phase steps of the phase multiplexer. Each phase multiplexer is advanced or retarded in response to pump-up (pumpup) or pump down (pumpdn) pulse streams received from phase comparator and pulse generators included in the clock recovery loop of each channel.

FIG. 1 shows an embodiment in which each channel (port [1:6]) consists of a 10 mb CRM and a 100 mb CRM. A more detailed description of the FIG. 1 system may be found in the U.S. patent application Ser. No. 09/080,740, entitled "10/100 MB Clock recovery Architecture for Switches, Repeaters and Multi-Physical Layer Ports", filed on May 18, 1998; application Ser. No. 09/080,740 is hereby incorporated by reference in its entirety.

Figure 2:
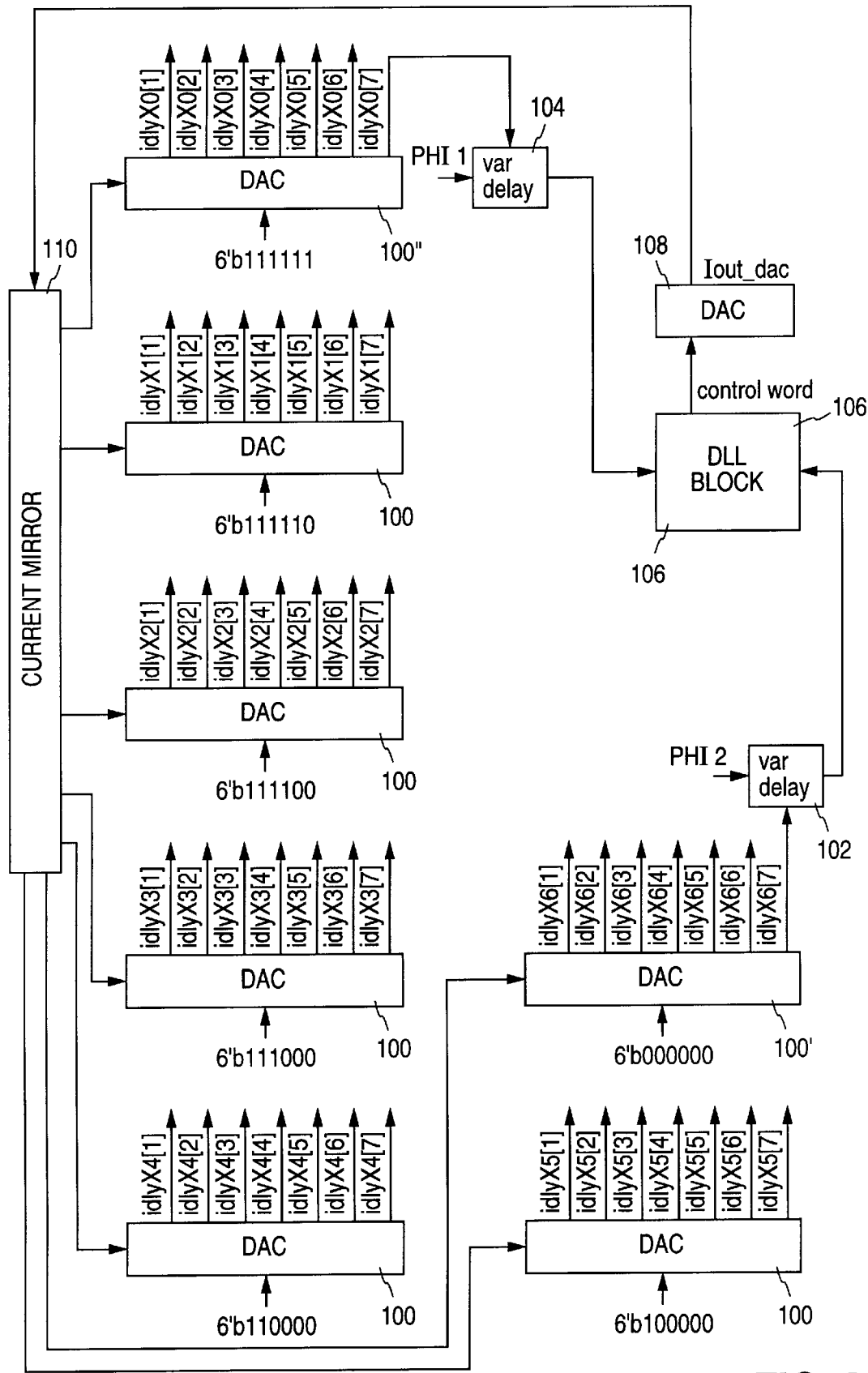
FIG. 2 is a block diagram illustrating an embodiment of a central delay interpolator calibration circuit utilizable in the FIG. 1 circuit.

The phase multiplexer and interpolator circuit 10 includes a central delay interpolator calibration block, which is shown in FIG. 2. The purpose of this block is to provides six current references to the phase interpolator block of each port. Each of the currents comes from a 6 bit digital-to-analog converter (DAC) 100 to a current providing a different delay. The following table shows relationship between control settings and output current:

| Control Setting | Output Current |
|---|---|
| 6'b000000 | Iconst + 0 * delta_I |
| 6'b100000 | Iconst + 1 * delta_I |
| 6'b110000 | Iconst + 2 * delta_I |
| 6'b111000 | Iconst + 3 * delta_I |
| 6'b111100 | Iconst + 4 * delta_I |
| 6'b111110 | Iconst + 5 * delta_I |
| 6'b111111 | Iconst + 6 * delta_I |

These reference currents are:

idly X0 [6:1] creates a delay in variable delay stage idly X1 [6:1] creates this delay plus 55 ps in variable delay stage idly X2 [6:1] creates this delay plus 110;s in variable delay stage idly X3 [6:1] creates this delay plus 165 ps in variable delay stage idly X4 [6:1] creates this delay plus 220 ps in variable delay stage idly X5 [6:1] creates this delay plus 275 ps in variable delay where the index refers to the destination port for the current. Note that idly X6 current outputs are only used internally to the delay calibrator and are not sent to ports. The reason for this will become apparent from the description that follows.

The reference currents are used in the delay interpolator blocks to create 6 delays, from constant delay to constant delay plus 275 ps, in 55 ps increments. The purpose of the FIG. 2 calibrator block is to insure that the delays occur in 55 ps increments. With reference current I_ref to the DACs 100 constant, at fast PVT each delay increment would be less than at slow PVT. Thus the calibrator block adjusts Iout_dac until the difference in delay between a delay interpolator block set to min delay and a delay interpolator block set to max delay is exactly equal to 1 gross phase step (in this case 333 ps).

As further shown in FIG. 2 the delay interpolator calibrator includes a DAC 100' with the control input set to all zeros (full delay) and biasing a variable delay element 102 with CGM phase phi2 as it's input, and a DAC 100" with the control input set to all ones (min delay) biasing a variable delay element 104 with CGM phase phi1 as its input, phi2 being advanced 333 ps from phi1.

The variable delay stages 102 and 104 are conventional current controlled delay stages. The basic function is that the delay through this stage should increase as control current is decreased. The outputs of variable delay stages 102 and 104 are the input to a phase comparator in the delay locked loop (DLL).

The DLL block 106 implements the phase comparator and digital loop filter of a delay locked loop. The function is such that, if the calibration input (output of variable the delay stage 102) is leading that of the reference input (output of variable delay stage 104), then the control word output is decreased; otherwise, the control word is increased. Adjustment of control word with respect to leading and lagging of calibration and reference inputs is not direct, but attenuated with proportional control. The DLL block 106 modifies the control word to DAC 108 until the bias current for DACs 100' and 100", provided through current mirror 110, is such that the difference in delay between DAC 100' (set to max delay) and DAC 100" (set to min delay) is equal to the phase difference between phi1 and phi2, which is exactly 333 ps.

DAC 108 is an 8 bit binary weighted digital to analog converter. The 8 bit control word to DAC 108 controls the output current Iout-dac according to this formula:

$$Iout\_dac = control\_word[7:0] * I\_ref$$

The current mirror 110 takes the input current and creates multiple output currents of the same value as the input current.

Thus, each DAC 100 outputs 6 currents that are mirrored to the blocks that provide the phase muxing and interpolation in the actual clock recovery channels. This means that as a clock recovery channel's delay interpolator block's input control from the delay selector is changed by one bit, the delta delay will be exactly 55 ps. As stated above, each of the current sources provided by the DACs 100 are slightly weighted to compensate for the non_linear delay vs. current characteristic of the variable delay stages.

Figure 3:
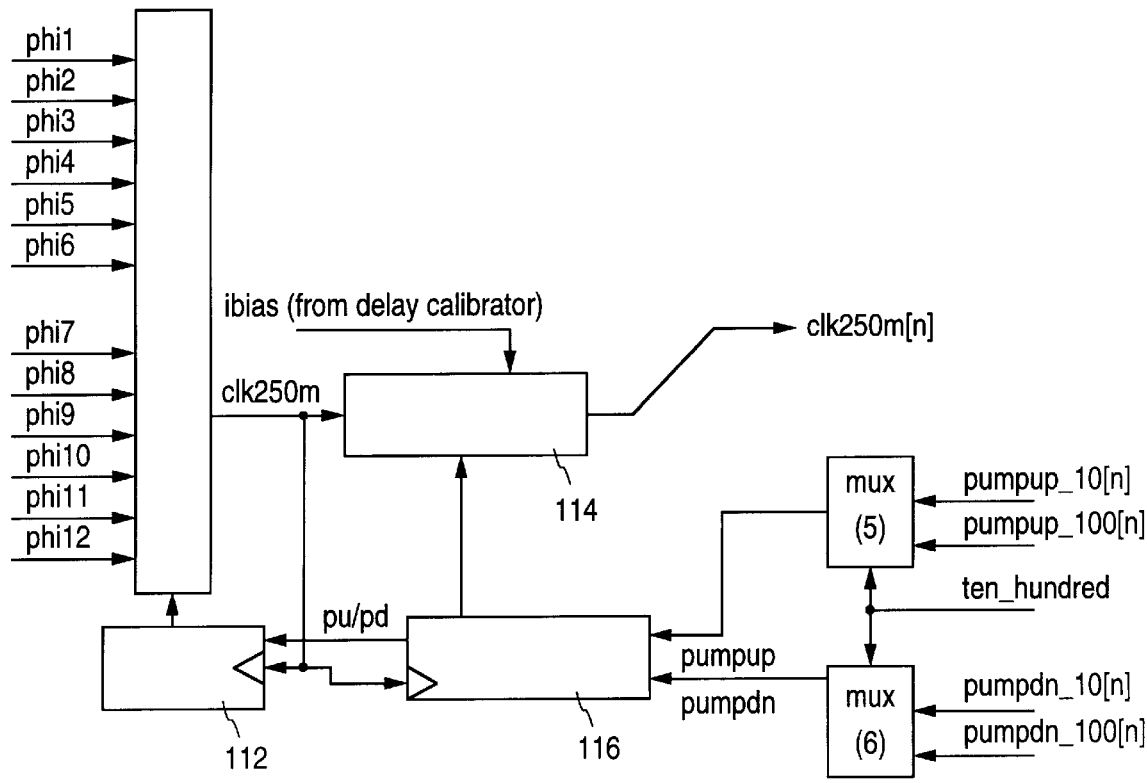
FIG. 3 is a block diagram illustrating an embodiment of a phase multiplexer and interpolation circuit utilizable in the FIG. 3 circuit.
Figure 4:
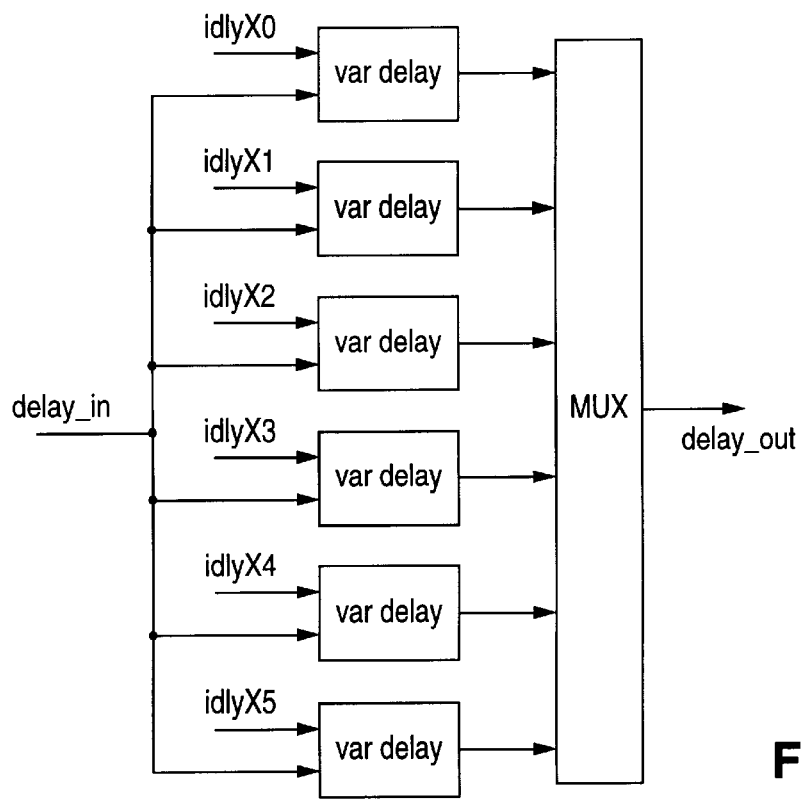
FIG. 4 is a block diagram illustrating an embodiment of a delay interpolator circuit utilizable in the FIG. 3 circuit.

Referring to FIG. 3, the phase multiplexer and interpolator block includes a phase multiplexer 111, a phase selector 112, a delay interpolator 114 and a delay selector 116.

As discussed above, the digital loop filter of a phase picker PLL outputs a pumpup and pumpdn pulse stream which is used to modify a 6 bit control word output of delay selector 116 in the following manner. The 6 bit control word will always contain exactly one bit set to "1", with all other bits set to zero. Every pumpup pulse causes the control word to shift the "1" one position to right, while every pumpdn pulse causes the control word to shift the "1" one position to left. For example, if the delay selector 116 contains 01000, 2 pumpup pulses will result in a of 00010; from here, 3 pumpdn pulses will result in a value of 10000.

The value of the delay selector 116 is used to select one of 6 delayed versions of the output of phase multiplexor 111, each of the delays differing by 55 ps. The following table shows the control word and associated delays and control currents from the calibration block (described above):

| Control Word | Current used for selected var delay | Delay |
| --- | --- | --- |
| 6'h100000 | IdlyX5 [n] | Const delay + 275 ps |
| 6'h010000 | IdlyX4 [n] | Const delay + 220 ps |
| 6'h001000 | IdlyX3 [n] | Const delay + 165 ps |
| 6'h000100 | IdlyX2 [n] | Const delay + 110 ps |
| 6'h000010 | IdlyX1 [n] | Const delay + 055 ps |
| 6'h000001 | IdlyX0 [n] | Const delay + 000 ps |

When the delay selector 116 contains 000001, and a pumpup pulse is received, the delay selector 116 shifts to 100000, and a pumpup pulse is sent to phase selector shift register 112. This causes the phase multiplexer 111 to select a phase advanced 333 ps from the current phase. For example, if the current phase is phi3, the phase mux 111 would select phi4. Since the delay selector 116 shifts to 100000 at same time that the phase mux 111 advances phase by 333 ps, the net result is advancing the phase by 55 ps, the same as if the delay selector 116 received a pumpup pulse when the value of delay selector 116 was 010000 (or some value other than 000001), causing the delay selector 116 to move to 001000. When the delay selector 116 contains 100000, and a pumpdn pulse is received, the delay selector 116 shifts to 000001, and a pumpdn pulse sent to phase selector 112. This causes the phase mux 111 to select a phase retarded 333 ps from the current phase. For example, if the current phase is phi3, the phase mux 111 will select phi4. Since the delay selector shifts to 000001 at same time that the phase mux 111 retards phase by 333 ps, the net result is retarding the phase by 55 ps, the same as if the delay selector 116 received a pumpdn pulse when the value of delay selector 116 was 001000 (or some value other than 100000), causing the delay selector 116 to move to 010000.

Phase selector 112 is a bidirectional shift register with a 1 bit always set; that bit and QZ are used to turn on one of the 12 transfer gates in the phase mux 111. The delay selector 116 is also just a bidirectional shift register with 1 bit always set; the bit's Q and QZ are used to turn on one of the 6 transfer gates in the delay selector 114. The mux in the delay selector 114 can be thought of as a fine tuning phase shifter, while the phase mux 111 can be thought of as a coarse tuning phase shifter.

The following table provides examples showing values of coarse and fine phase tuners while continuously advancing phase in response to pumpup signals:

| pi_digital (4) | clkmux_sr (1) | coarse phase adjust from last phase | fine phase adjust from last phase | total adj from last |
| --- | --- | --- | --- | --- |
| 6'b001000 | 12'b000001000000 | N/A | N/A | N/A |
| 6'b000100 | 12'b000001000000 | 0 | −55 ps | −55 ps |
| 6'b000010 | 12'b000001000000 | 0 | −55 ps | −55 ps |
| 6'b000001 | 12'b000001000000 | 0 | −55 ps | −55 ps |
| 6'b100000 | 12'b000000100000 | −333 ps | +275 ps | −55 ps |
| 6'b010000 | 12'b000000100000 | 0 | −55 ps | −55 ps |

For extremely accurate delay interpolation, it may be desirable to implement an architecture having two phase multiplexers per channel, with each channel doing its own calibration using the same interpolators that are doing the interpolation. The second phase multiplexer would always select a phase advanced from the current phase; and the delay selector for this second interpolator would be set such that the delay between the two delay interpolator outputs would always be 667 ps when the I_ref is correctly calibrated. This approach adds power and area, but may be better suited to some applications. It is anticipated that using a central calibration circuit will be sufficient for 100BT, but a calibrator per channel may be required for 1000BT.

Physically, the phase multiplexers and phase interpolators are placed very close to a CGM. They take up a very small area (perhaps 10 sq mils for a single phase multiplexer and interpolator on a 0.35 um process), so they can be packed in close to the CGM which allows skew control. The output of the phase interpolator is a non skew critical signal, so the CRM's themselves may be placed very far from the CGM, preferable close to the TP-PMD block at each port. Similarly, the pumpup and pumpdn outputs from the pulse stream combiner are non skew critical.

The inventive approach to increasing phase resolution described above provides several advantages over previous approaches. The interpolator itself operates on only a single phase from the CGM (the output of the channels phase multiplexer), and adjusts the delay linearly between the gross phase steps. This enables only one phase multiplexer per CRM channel. While two clock signal phases are required by the calibrator, only one calibrator is required and can be shared with any number of CRM channels. Also, this type of interpolator is very powerful and area efficient since it only uses a small number of VCO stages (6 in this example), a small phase multiplexer (12:1 in this example), six differential delay stages biased by the calibration block, and a second phase multiplexer (6:1 in this example) used to select on of the six dealy stage outputs. A CGM with a small number of phases can have the phase resolution enhanced by this interpolator. In contrast, the coupled VCO method described requires multiplying the number of VCO stages by M, where M is the desired enhancement factor for the phase resolution. The method based on using delay-locked-loops requires M+1 DLL's, where M is the desired enhancement factor. The mixer approach requires N/2 mixers for a halving of resolution. Since the interpolation function is done post multiplexing, the skew on the N CGM phases entering the phase multiplexer can be controlled to a finer precision, since there are fewer signals being routed.

For purposes of comparison with the other phase resolution methods discussed above, consider a device with twelve integrated clock recovery channels requiring a phase resolution of 80 ps. The method of the present invention would require the following circuitry: one 12 phase 250 mhz CGM; one DLL calibrator for delay interpolators; twelve 12:1 phase multiplexers; and twelve delay interpolators consisting of six delay stages biased by the calibration, and a second phase multiplexer (6:1 in this example) used to select one of the six delay stage outputs. For comparison, the coupled ring oscillator approach would require: one 50 phase coupled ring osc VCO and twelve 50:1 phase multiplexers (very hard to match skew with this fan-in to multiplexer).

Although accurate phase error quantization is not required for 100BT ethernet, the phase interpolator provides a method of phase error quantization for PLL's that do need more accurate quantization. This is typically the case when the DCD portion of the jitter budget is a large fraction of the total jitter budget.

To lock to the center of a bimodal jitter distribution requires being able to quantize the phase error. The resolution of the quantization limits the ability of the loop to accurately lock to the center of a bimodal distribution.

One method of quantizing the phase error is to use a slowly rising edge on the 125 Mhz clock and comparators with levels set such that, as the rising edge reaches that level, a fast edge is triggered. This results in N 125 Mhz clocks, with N being the number of comparators. The delay between the clocks depends on how uniform the slowly rising edge rises and the accuracy of the comparator trip points. However, this solution is not robust over PVT.

Other approaches have used delayed locked loops to create precision delay lines which can be used to sample an input signal and quantize the phase error based on the resolution of the delay line. This approach limits the resolution of the phase compare to the minimum delay possible in the delay line, which is process limited.

In contrast, the present approach uses the phase interpolator described to create eleven precisely spaced delays, where the difference in delays span 1.3 ns, the range of a fixed jitter specified in the TP-PMD spec. This gives a phase quantization resolution of 118 ps, about 4X smaller than that could be achieved with a delay line using the same process. Each delay is on the order of 1 ns, but the delta delay is kept at 118 ps over PVT. The delta delays are calibrated by using the delay interpolator, with the difference being that the inputs to the min and max delay stages are two phases from the CGM separated by two, rather than one phase step. This has the effect of doubling the range of the interpolation.

Clk125 m from the phase multiplexer is the input to each of the eleven equally spaced delays, ranging from delay+0 ns to delay+1.3 ns in 118 ps increments. The center delay becomes RXC, while the five lower delays are increasingly advanced RXC's, and the five upper taps are increasingly retarded RXC's. RXC and the advanced and retarded RXC's are the D input to eleven flops. These are specially designed flops that have equal setup and hold times and, therefore, act as knife edge phase detectors. The clocks of the flops are connected to the incoming data stream. At each rising edge of data, the eleven flops Q's can be used to create a 3 bit lead vector, and 3-bit lag vector, each vector giving the amount of lead or lag error, in 118 ps increments.

The following hdl illustrates this approach:

```
reg [10:0]pc;//11 flops
wire [10:0]rxc_dl://RXC d advanced and delayed in 118 ps increments
reg [2:0] lead_err, lag_err;//error vectors
//11 flops clocked by data, data input is rxc delay line
always@posedge data)
    pc<=#1 rxc_dl;
wire [5:0] lower_pc=pc[10:5];
always@ (lower_pc)
    casex (lower_pc)//synopsys parallel case
        6'b111111:lead_err=#1 3'b110;
        6'b011111:lead_err=#1 3'b101;
        6'b001111:lead_err=#1 3'b100;
        6'b000111:lead_err=#1 3'b011;
        6'b000011:lead_err=#1 3'b010;
        6'b?????1:lead_err=#1 3'b0001
        default:lead_err=#1 3'b000
endcase
wire [5:0] upper_pc=pc[5:0];
always@ (upper_pc)
    casex (upper_pc)//synopsys parallel_case
        6'b000000:lag_err=#1 3'b110;
        6'b000001:lag_err=#1 3'b101;
        6'b000011:lag_err=#1 3'b100
        6'b000111:lag_err=#1 3'b011
        6'b001111:lag_err=#1 3'b010
        6'b0?????:lag_err=1 3'b001
        default:lag_err=#1 3'b000
endcase
```

Data is recovered in the data recovery block, which is the same special flop used in phase comparators (1) and (2). The flop is clocked by the falling edge of RXC, with the D input being RX_P. With the loop in lock, the falling edge of RXC is the optional sampling position.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. A delay interpolation circuit comprising:

a phase interpolator calibrator that takes adjacent coarse phase signals from a voltage controlled oscillator (VCO) and uses closed loop feedback to create a reference current that is used to bias a digital-to-analog converter DAC such that the full range of the DAC causes a current controlled delay cell to span a delay equal to the phase difference between adjacent coarse phase signals in a linear manner;

a delay interpolator that delays a clock signal output received from a phase multiplexer by an integer multiple N of a predefined phase delay, clock signal output delay being calibrated by the phase interpolator calibrator;

a delay adjuster connected to the delay interpolator for providing the value of N to the delay interpolator;

a delay selector that responds to a phase difference signal corresponding to the phase difference between an incoming data signal and a reference signal by providing corresponding first and second control signals, the first control signal being provided to the delay adjuster for use in determining the value of N; and a coarse phase selector that responds to the second control signal by providing a coarse phase select signal to the phase multiplexer, the coarse phase select signal causing the phase multiplexer to select the clock signal from among a plurality of coarse phase-separated clock signals provided as inputs to the phase multiplexer.

* * * * *